(12) United States Patent
Ricard et al.

(10) Patent No.: US 7,466,184 B2
(45) Date of Patent: Dec. 16, 2008

(54) LEVEL SHIFTER

(75) Inventors: Nicolas Ricard, Coublevie (FR); Jean-Luc Moro, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/755,189

(22) Filed: May 30, 2007

(65) Prior Publication Data

US 2008/0007314 A1 Jan. 10, 2008

(30) Foreign Application Priority Data

May 31, 2006 (FR) .................................. 06 51964

(51) Int. Cl.
*H03L 5/00* (2006.01)
(52) U.S. Cl. ............................ 327/333; 326/68; 326/81
(58) Field of Classification Search .................. 326/62, 326/63, 68, 80, 81; 327/333
See application file for complete search history.

(56) References Cited

U.S. PATENT DOCUMENTS 6,163,170 A * 12/2000 Takinomi ..................... 326/81

| | | | |
|---|---|---|---|
| 2003/0169225 A1 | 9/2003 | Tobita | |
| 2004/0263220 A1 | 12/2004 | Sabut et al. | |
| 2008/0122516 A1* | 5/2008 | Park et al. | 327/333 |
| 2008/0175074 A1* | 7/2008 | Parris et al. | 365/189.15 |

FOREIGN PATENT DOCUMENTS

| | | |
|---|---|---|
| JP | 04269011 | 9/1992 |
| JP | 05284005 | 10/1993 |
| WO | 2006/033638 A1 | 3/2006 |

* cited by examiner

*Primary Examiner*—Lincoln Donovan
*Assistant Examiner*—William Hernandez
(74) *Attorney, Agent, or Firm*—Seed IP Law Group PLLC

(57) ABSTRACT

A device for shifting the level of a first signal of relatively low amplitude which is a function of a first supply voltage to a second signal of relatively high amplitude which is a function of a second supply voltage, comprising, between a first terminal of application of the second supply voltage and a first input terminal, a branch of two transistors of opposite types in series, having their junction point defining an output terminal, the respective control terminals of the transistors being connected to terminals of application of relatively high and low bias voltages by first resistive elements, a second input terminal, receiving the inverse of the signal applied on the first terminal, being connected to each of the control terminals of the transistors by first capacitive elements and the first input terminal being connected to each of the terminals of application of the bias voltages by second capacitive elements in series with second resistive elements.

23 Claims, 4 Drawing Sheets

LEVEL SHIFTER

TECHNICAL FIELD

The present disclosure generally relates to level-shifting circuits which have the purpose of converting a signal of relatively low amplitude into a signal of higher amplitude. Such circuits are generally designated as level shifters and are present in input/output circuits of electronic devices to be used as an interface between signals of different levels.

The present disclosure applies for example to level shifters intended to process digital signals, for example, between an electronic circuit core and peripherals of this core, or between two circuits. An example of application relates to the control of a DDR-type (Double Data Rate) memory.

BACKGROUND INFORMATION

FIG. 1 shows a first example of a voltage step-up device used in integrated circuits, for example, to convert digital signals originating from digital blocks processing data under a relatively low voltage Vdd, sent to so-called analog blocks processing the data under a voltage Vcc with an amplitude relatively higher than voltage Vdd.

In the following description, and unless otherwise mentioned, on-state voltage drops in switches will be neglected, knowing that levels Vcc, Vdd and the ground are in practice only reached to within the voltage drops in the series resistors of the on-state switches.

The device of FIG. 1 comprises two parallel branches between two terminals 1 and 2 of application of a relatively high power supply voltage Vcc corresponding to the states desired for an output signal Vout. Each branch comprises three transistors in series, respectively, a P-channel transistor P1 or P2, and two N-channel transistors N1, N3 or N2, N4. The sources of transistors P1 and P2 are connected to terminal 1 while their respective drains are connected to the respective drains of transistors N3 and N4 as well as to the gate of the transistor P1 or P2 of the other branch. The sources of transistors N3 and N4 are connected to the respective drains of transistors N1 and N2 having their sources connected to ground 2. A digital input signal Vin switching between two states 0 and 1 (state 1 being shown by voltage Vdd lower than said voltage Vcc) is applied on a terminal IN connected to the respective gates of transistors N1 and N2 by being inverted (inverter 5) for one of the two branches (for example, for the connection to transistor N2). The drain of transistor P2 defines an output terminal 4 providing signal Vout. Inverter 5 is an inverter supplied with voltage Vdd. A reference voltage provided by a bias source 6 (REF) is applied to the common gates of transistors N3 and N4 so that they are respectively turned on or turned off according to the conduction or to the blocking of the transistor N1 or N2 with which they are associated.

The structure of FIG. 1 corresponds to a cell of locking, by transistors P1 and P2, of the level present at input IN on output terminal 4. An inverse output can be taken on drain 7 of transistor P1.

When a signal at state 0 (ground) is present at input IN of the device, transistor N1 is off while transistor N2 is on due to the inversion performed by inverter 5. The on state of transistor N2 is transferred to transistor N4, which has its gate biased to a voltage selected to be greater than the threshold voltage of transistor N4 plus the voltage drop in transistor N2 in the on state, while transistor N3 remains off. The voltage of terminal 4 is drawn to ground by on transistors N4 and N2. This low voltage being transferred onto the gate of transistor P1, said transistor is turned on, which locks the off state of transistor P2 by bringing its gate to a level close to voltage Vcc. The voltage obtained at output 4 thus is a low state 0 (close to ground) and output 7 is at a high level close to level Vcc.

In the presence of a high state on input IN, transistors N1 and N3 are on while transistors N2 and N4 are off. The conduction of transistors N3 and N1 causes that of transistor P2 by drawing its gate towards ground, which raises the level of output terminal 4 to a voltage close to level Vcc. Transistor P1 is locked in an off state by this level close to the level Vcc applied on its gate. A high state is thus effectively obtained at output 4 and a low state is obtained at output 7.

In certain applications, the used MOS transistors are distinguished according to their respective breakdown voltage which depends, in practice, on their oxide thickness. The breakdown voltage of the transistors varies in the same direction as the oxide thickness. The transistor switching speed however varies inversely to this oxide thickness. A way to compensate for this thickness is to increase the transistor size (gate width to length ratio—W/L).

Reference will be made hereafter to digital transistors to designate transistors supporting a relatively low voltage Vdd (relatively thin gate oxide—simple oxide) and to analog transistors to designate transistors supporting voltage Vcc (relatively thick gate oxide—double oxide).

In the example of FIG. 1, transistors N1 and N2 may be digital transistors since the voltage drop introduced by transistors N3 and N4 is sufficient to limit the voltage across transistors N1 and N2. Transistors P1, P2, N3, and N4 however are analog transistors to stand voltage Vcc at their respective terminals.

FIG. 2 is a schematic block diagram of an example of application to an interface 12 intended for a level conversion between a core 10 of an integrated circuit and a memory 20 of another integrated circuit. In such an application, the states of data signals DATA1 to DATAn between levels 0 and Vdd is to be adapted to the voltage levels used by memory 20 between 0 and Vcc. A differential clock signal CLK provided by core 10 is to also be transmitted to memory 20. In the case of a DDR-type memory, the two edges (rising and falling) of the clock signal are exploited by memory 20, which uses processing signal CLK and its inverse (inverter 15).

Input/output circuit 12 shown in FIG. 2 comprises as many level shifters 30 (LS) as there are signals to be converted. Further, in the application to memories, the respective outputs OUT of level shifters 30 cross pre-amplification circuits 31 (PREDRIVER), then buffer amplifiers 32 (BUFF) before provision of the signals on output terminal 14 of circuit 12. Each terminal 14 is connected by a conductor 17 of a printed circuit board to an input terminal 28 of memory 20. As for converted clock signal HCLK, it is restored by means of a comparator 24 (COMP) shaping the signals provided on the two terminals 28 corresponding to the two processing lines of signals CLK and of its inverse.

Input signals CLK, DATA1, and DATAn are provided by circuits supplied by voltage Vdd, which thus corresponds to the voltage of input stages 35 of level shifters 30. All the circuits downstream of level shifters 30, as well as output stages 36 of these circuits, are powered by relatively high voltage Vcc. For example, voltage Vdd is on the order of one volt while voltage Vcc is 2.5 volts, or even 1.8 volts.

What has been discussed in relation with a digital block 10 and a so-called analog block 20 of two distinct electronic circuits connected to each other by conductors 17 of a printed circuit board also applies to two blocks of a same integrated circuit connected by conductive tracks.

In interfaces intended for memories, the conventional level shifters 30 are of the type of those illustrated in FIG. 1. Such circuits enable operation at frequencies up to a few hundreds of megahertz.

A disadvantage of the level shifter of FIG. 1 is that to operate at frequencies of several hundreds of megahertz, analog transistors must be of relatively large size. This increases the dynamic power consumption, generates significant current surges and bounces on the power supplies. This thus disturbs the signal.

Another disadvantage of the circuit of FIG. 1 is that the duty cycle of the output signal is dependent on temperature, on voltages Vcc and Vdd, on the manufacturing conditions and on the differences between the N-channel and P-channel MOS transistors, as well as between transistors N1 and N2.

Another disadvantage of the circuit of FIG. 1 is that a possible supply noise on the digital signal may generate an output phase shift. In other words, a variation of the propagation time between terminals IN and OUT translates as a phase noise on the signal.

Such constraints results in that, in practice, a level shifter such as illustrated in FIG. 1 is limited to a frequency from 3 to 400 megahertz.

One of the constraints of the application to a memory such as illustrated in FIG. 2 is that data signals (non-periodic) are to be provided to the memory synchronously with the clock signal. Accordingly, the propagation time in the input/output circuits of the differential clock obtained from signal CLK are to be the same as in the input/output circuits processing data. This results in a practical obligation to have identical level shifters both for the data and for the clock signal, and thus two level shifters for the clock signal.

FIG. 3 shows a second example of level shifter, described in US patent application publication no. 2004/263220.

The circuit of FIG. 3 comprises two inverters 41 and 42 formed of digital transistors (supplied by voltage Vdd) and respectively receiving signal IN to be reproduced on an output terminal OUT and inverse NIN of this signal. Signals IN and NIN may originate from flip-flops of the digital circuit if the application requires a perfect synchronization between these signals. The respective output terminals 43 and 44 of the inverters are each connected to a (positive) terminal 1 of application of voltage Vcc by two transistors in series, respectively N-channel transistors N3 or N4, and P-channel transistors P1 or P2, the P-channel transistors being on the side of terminal 1. Each output 43 or 44 is further connected to a first electrode of a capacitive element C3 or C4 having its second electrode connected to the gate of transistor N4 or N3 of the other branch. The respective gates of transistors N3 and N4 are further connected, by resistive elements R3 and R4, to a terminal 45 of application of a bias voltage (positive in this example) Vbias. Transistor P2 has its gate connected to the drain of transistor P1 while its own drain forms output terminal OUT. The gate of transistor P1 is connected by a resistor R1 to the gate of transistor P2 and by a capacitor C1 to terminal 1.

The function of capacitive elements C3 and C4 is to directly transmit onto the gates of transistors N3 and N4 the edges provided by inverters 41 and 42, which enables accelerating the level shifter speed. Resistors R3 and R4 take part in the creation of resistive and capacitive cells with elements C3 and C4, introducing a time constant in the discharge of the gate of transistor N3 or N4 which has been brought to the high state.

Resistor R1 and capacitor C1 introduce a delay in the switching of transistor P1 with respect to that of transistor P2, which increases the switching speed of transistor P2.

Bias voltage Vbias, selected to be greater than the threshold voltage of transistor N4, is lower than the sum of this threshold voltage and of supply voltage Vdd on the digital side.

In the circuit of FIG. 3, transistors P1, P2, N3, and N4 all are analog transistors but are made fast due to a capacitive control. Further, they are of smaller size, generate less power consumption, less current surge, and thus less noise on the power supplies. Further, the propagation time of the rising and falling edges (and thus the duty cycle) becomes independent from voltage Vdd, from temperature, and from the manufacturing conditions.

FIG. 4 schematically shows an example of the forming of a voltage source providing bias voltage Vbias on node 45 of the circuit of FIG. 3. This voltage source is formed of a series association of a P-channel MOS transistor P5, of a resistor R5, and of an N-channel MOS transistor N6 between terminals 1 and 2 of application of voltage Vcc. Transistor P5 is diode-assembled, its gate being connected to its drain, itself connected to a first terminal of resistor R5. Transistor N6 is also diode-assembled, its gate being connected to its drain, itself connected to the other end of resistor R5 and defining terminal 45 of provision of voltage Vbias. Transistors P5 and N6 are analog transistors.

A disadvantage of the level shifter of FIG. 3 is that a phase jitter appears in case of a non-periodic input signal IN.

This phase jitter in particular originates from the diode (even delayed) formed by transistor P1, which results in that the gate level of transistor P2 keeps in memory (builds up the history) of past switchings. As a result, the longer the input signal remains in a steady state, the more the level of this gate increases to tend towards level Vcc decreased by the threshold voltage of transistor P2 (typically on the order of 0.2 V). Accordingly, if the input signal does not switch periodically, the propagation time in the level shifter depends on the input signal. Such a phenomenon does not occur for a periodic clock signal (the gate of transistor P2 discharges with the same periodicity as it charges), but causes a phase jitter in the case of a non-periodic signal (typically, a data signal). This reduces the acquisition window (time for which it is certain to have the data at state 1 or 0) due to an increase in uncertainties about the state of the datum.

In other words, such a level shifter has, over that of FIG. 1, the advantage of being fast for the processing of a clock signal, but is not appropriate for a pseudo-random input signal, even if the edges of this input signal are synchronous with a clock signal. Now, this is especially the case in the application of data to be converted by means of an input/output circuit of the type illustrated in FIG. 2 and more generally as soon as the signal to be converted is not a clock signal.

BRIEF SUMMARY

An embodiment of the present invention overcomes all or part of the disadvantages of known level shifters.

An embodiment of the present invention more specifically provides a level shifter capable of operating at high frequencies (typically, on the order of one gigahertz).

An embodiment of the present invention also provides a circuit compatible with a periodic or pseudo-random input signal.

An embodiment of the present invention also provides a low-consumption solution.

An embodiment of the present invention also provides a low-bulk solution.

An embodiment of the present invention provides a device for shifting the level of a first signal of relatively low amplitude which is a function of a first supply voltage to a second signal of relatively high amplitude which is a function of a second supply voltage, comprising, between a first supply terminal of application of the second supply voltage and a first input terminal, a branch of two transistors of opposite types in series, having their junction point defining an output terminal, the respective control terminals of the transistors being coupled to terminals of application of relatively high and low bias voltages by first resistive elements, a second input terminal, receiving the inverse of the signal applied on the first input terminal, being coupled to each of the control terminals of the transistors by first capacitive elements and the first input terminal being coupled to each of the terminals of application of the bias voltages by second capacitive elements in series with second resistive elements.

According to an embodiment of the present invention, the bias voltages are such that the low bias voltage tends to make the transistor coupled to the first input terminal more conductive than the transistor coupled to said first supply terminal.

According to an embodiment of the present invention, a second branch of two transistors of opposite types in series couples said first supply terminal of application of the second supply voltage to the second input terminal, control terminals of the transistors of the second branch being coupled to junction points of the second capacitive and resistive elements, a junction point of the second branch defining a second output terminal providing a signal inverted with respect to a signal provided by the first output terminal.

According to an embodiment of the present invention, the capacitive elements have values on an order of one femto-farad.

According to an embodiment of the present invention, the capacitive elements all have same values, the resistive elements all having same values.

According to an embodiment of the present invention, the capacitive elements associated with the transistors of a first type have a lower value than the capacitive elements associated with the transistors of a second type, their corresponding resistive elements following an inverse variation.

According to an embodiment of the present invention, said input terminals correspond to respective outputs of inverters receiving as an input digital signals inverted with respect to each other, said inverters being powered by said first supply voltage.

According to an embodiment of the present invention, said first supply terminal of application of the second supply voltage is coupled to each output terminal by an additional transistor of the first type, a control terminal of each additional transistor being connected by a controllable switch to the other output terminal.

According to an embodiment of the present invention, the transistors of opposite types are P-channel MOS transistors and N-channel MOS transistors, the supply voltages being positive with respect to a common reference level.

One embodiment of the present invention also provides an input/output device receiving at least a first digital signal of relatively low amplitude from a digital circuit and providing at least one signal of relatively high amplitude intended for a second circuit, comprising at least one level shifter according to the above-described level shifter.

According to an embodiment of the present invention, the device receives a non-periodic signal.

According to an embodiment of the present invention, the at least one signal of relatively high amplitude is a differential clock signal.

The foregoing and other features of the present invention will be discussed in detail in the following non-limiting description of one or more specific embodiments in connection with the accompanying drawings.

DETAILED DESCRIPTION

Figure 1:
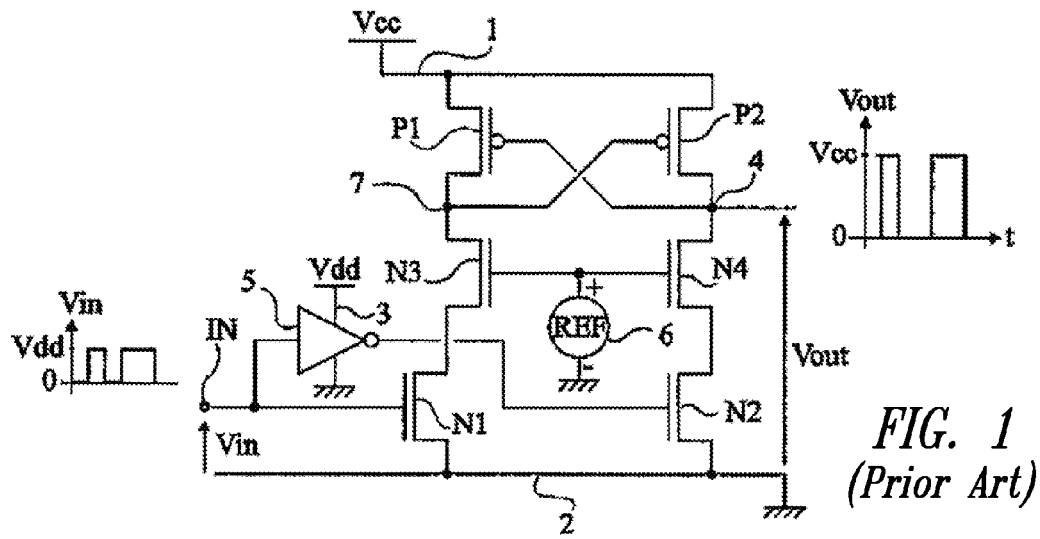
FIG. 1, previously described, shows a first example of a level shifter.

In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Same elements have been designated with same reference numerals in the different drawings. For clarity, only those steps which are useful to one or more embodiments of the present invention have been shown and will be described. In particular, the circuits for generating the digital signals to be converted as well as the circuits for exploiting these signals have not been detailed, embodiments of the present invention being compatible with any conventional exploitation of a level shifter.

The various embodiments of the present invention will be more specifically described hereafter in relation with an example of application to the control of a DDR memory. It however more generally applies to any circuit using a level shifter, for example, USB interfaces, LVDS (Low Voltage Differential Signal) series interfaces, etc.

Figure 5:
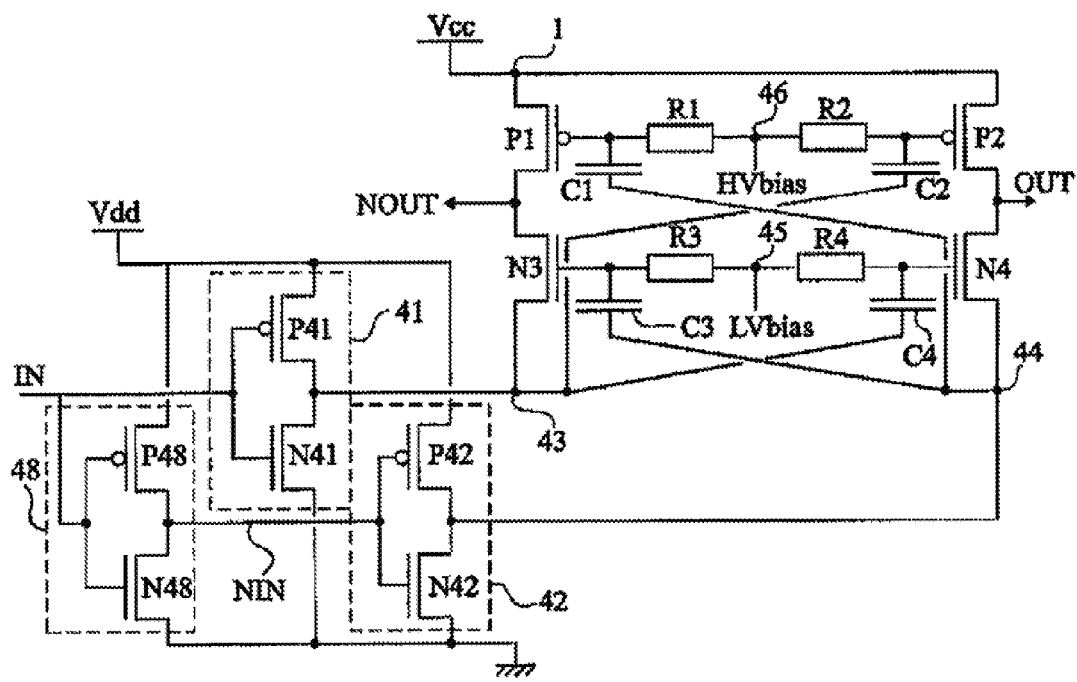
FIG. 5 shows a level shifter according to a first embodiment of the present invention.

FIG. 5 shows a first embodiment of a level shifter according to the present invention.

As previously, the level shifter exploits signals IN and NIN provided, for example, at the input of inverters 41 and 42 powered by voltage Vdd on the digital block side and having their respective outputs 43 and 44 each connected to a terminal 1 of application of voltage Vcc on the analog side via two transistors N3, P1 and N4, P2, respectively with an N channel and a P channel. As previously still, the respective gates of transistors N3 and N4 are connected to outputs 44 and 43 by means of capacitive elements C3 and C4 and to a terminal 45 of application of a first bias voltage LVbias through resistors R3 and R4.

According to this embodiment of the present invention, respective outputs 43 and 44 of inverters 41 and 42 are also connected to the respective gates of transistors P2 and P1 of the opposite branch by capacitive elements, respectively C2 and C1, the gates of transistors P1 and P2 being further connected to a terminal 46 of application of a second bias voltage HVbias through resistors R1 and R2. The drain of transistor P2 corresponding to the drain of transistor N4 defines an output terminal OUT arbitrarily said to be direct (reproducing signal IN or the inverse of the signal of terminal 43) while the drain of transistor P1 common with the drain of transistor N3 defines an output terminal NOUT arbitrarily said to be inverse (reproducing signal NIN or the inverse of the signal of terminal 44). Transistors P1 and P2 are of identical size, as well as transistors N3 and N4.

The function of signal LVbias is to turn on one of transistors N3 and N4. The function of signal HVbias, of a greater level than signal LVbias, is to turn on one of transistors P1 and P2 according to the input signal.

An embodiment of the structure provided by FIG. 5 suppresses the phase jitter due to a non-periodic signal.

Figure 3:
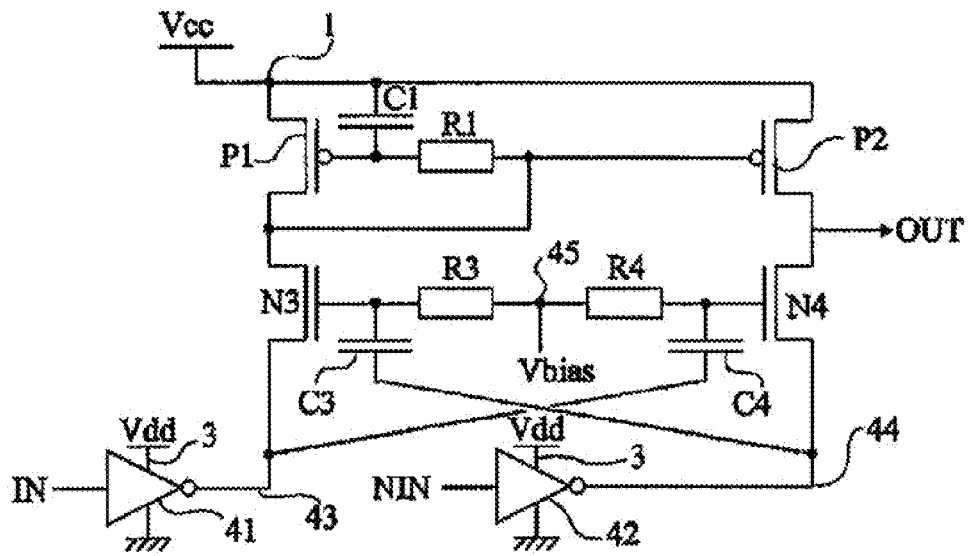
FIG. 3 shows a second example of a level shifter.

Another embodiment enables an operation with differential outputs, which is not allowed by the previously-discussed circuit of FIG. 3.

Figure 4:
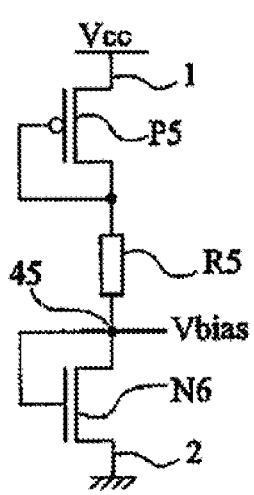
FIG. 4, previously described, shows an example of a circuit for generating a voltage for biasing the circuit of FIG. 3.
Figure 6:
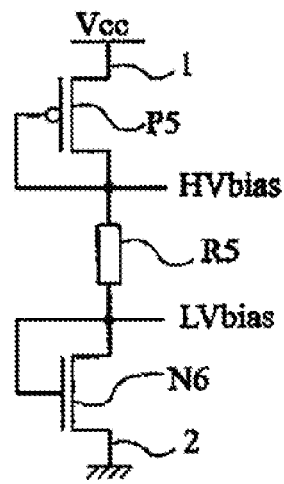
FIG. 6 shows an example embodiment of a circuit for providing bias voltages for the device of FIG. 5.

FIG. 6 shows an example of a circuit for generating bias voltages LVbias and HVbias. This circuit has the structure previously discussed in relation with FIG. 4, that is, a P-channel MOS transistor P5 (diode-assembled) in series with a resistor R5 and with an N-channel MOS transistor N6 (also diode-assembled) between terminals 1 and 2. The drain of transistor P5 provides relatively high bias voltage HVbias while transistor N6 provides relatively low bias voltage LVbias.

The levels of signals HVbias and LVbias are selected so that signal LVbias makes transistor N4 or N3 more conductive than the respective transistor P2 or P1 of the concerned branch. This ensures a low level (0) on terminal OUT in steady state when input IN is at the high level (1).

Other bias circuits may be provided, provided to respect the provision of a voltage LVbias greater than the threshold voltage of transistors N3 and N4 and, to respect the above condition on transistors N3 and N4 with respect to transistors P2 and P1. In the example of FIG. 6, this leads to providing a transistor N6 having a gate width-to-length (W/L) ratio smaller than that of transistors N3 and N4.

On the high biasing side (HVbias), transistors P5, P1, and P2 may be selected with the same threshold voltage (and thus with identical sizes) to minimize the power consumption.

The respective values of capacitive elements C1, C2, C3, C4 and of resistors R1, R2 and R3 and R4 are selected according to the desired time constants (adapted to the operating frequency) for the RC cells formed by these elements. All time constants may be substantially identical. In one embodiment, capacitors C1 and C2 have identical values, as well as capacitors C3 and C4, resistors R1 and R2, and resistors R3 and R4. It may however be provided for them to be obtained with different individual elements from one RC cell to another. For example, capacitors C1 and C2 of greater value than capacitors C3 and C4 may be provided for the case where P-channel MOS transistors P1 and P2 have greater gate width-to-length ratios than transistors N3 and N4 then generating greater gate capacitances for these elements. The compensation on the obtained time constants is then performed by decreasing the values of resistors R1 and R2 with respect to resistors R3 and R4.

The order of magnitude of capacitive elements C1 to C4 is one femtofarad, which makes them integrable. The order of magnitude of the resistive elements is one kiloohms and they are thus also integrable.

In FIG. 5, inverters 41 and 42 have been represented by their respective diagrams of two MOS transistors with a P channel P41, respectively P42, and with an N channel N41, respectively N42, in series between terminals 3 and 2 of application of voltage Vdd and having their respective gates respectively receiving signals IN (transistors P41 and N41) and NIN (transistors P42 and N42).

Further, an additional optional inverter 48, formed of two P-channel and N-channel MOS transistors P48 and N48 in series between terminals 3 and 2, has been shown to illustrate an example of generation of signal NIN for the case where the digital block only provides signal IN. The gates of transistors P48 and N48 receive signal IN and their common drain receives signal NIN.

As a variation, terminal 43 is connected to the input of inverter 42 and inverter 41 is suppressed.

Further, the inverters 41 and 42 used for input signals IN and NIN may possibly correspond to digital circuit elements. These may for example be buffer circuits formed of digital transistors or any other control means capable of absorbing a static current. This amounts to considering that terminals 43 and 44 respectively receive inverse and direct signals referenced with respect to voltage Vdd as input signals. Inverters 41 and 42 have been illustrated to take into account the presence of an N-channel MOS transistor between terminal 43 and ground 2 and between terminal 44 and ground 2.

An embodiment of the solution of FIG. 5 provides a fast structure taking advantage of a capacitive transmission of the input signal edges without for all this generating an offset in case of non-periodic input signals. Indeed, the symmetry of the structure avoids this disadvantage of the conventional circuit.

Another embodiment provides that a single one of the structure branches exhibits a static power consumption and that the general static power consumption is thus independent from the input state.

For example, if input IN is at state 1, transistor N4 is off and output terminal OUT is drawn to voltage Vcc due to transistor P2. No static current flows through branch N4-P2. In the other branch, both transistors P1 and N3 are on. Accordingly, the only power consumption results from the power consumption in branch P1-N3 (through low transistor N41 of inverter 41 turned on so that layer 43 is at level 0). If signal IN is at state 0, there is no current in branch N3-P1, but there is a slight power consumption in branch P2-N4 (through low transistor N42 of inverter 42).

Whatever the state of the input signal, the static power consumption of the structure is thus equal to the bias current provided by transistor P5 or drawn by transistor N6, plus the current in one of the two branches.

Figure 2:
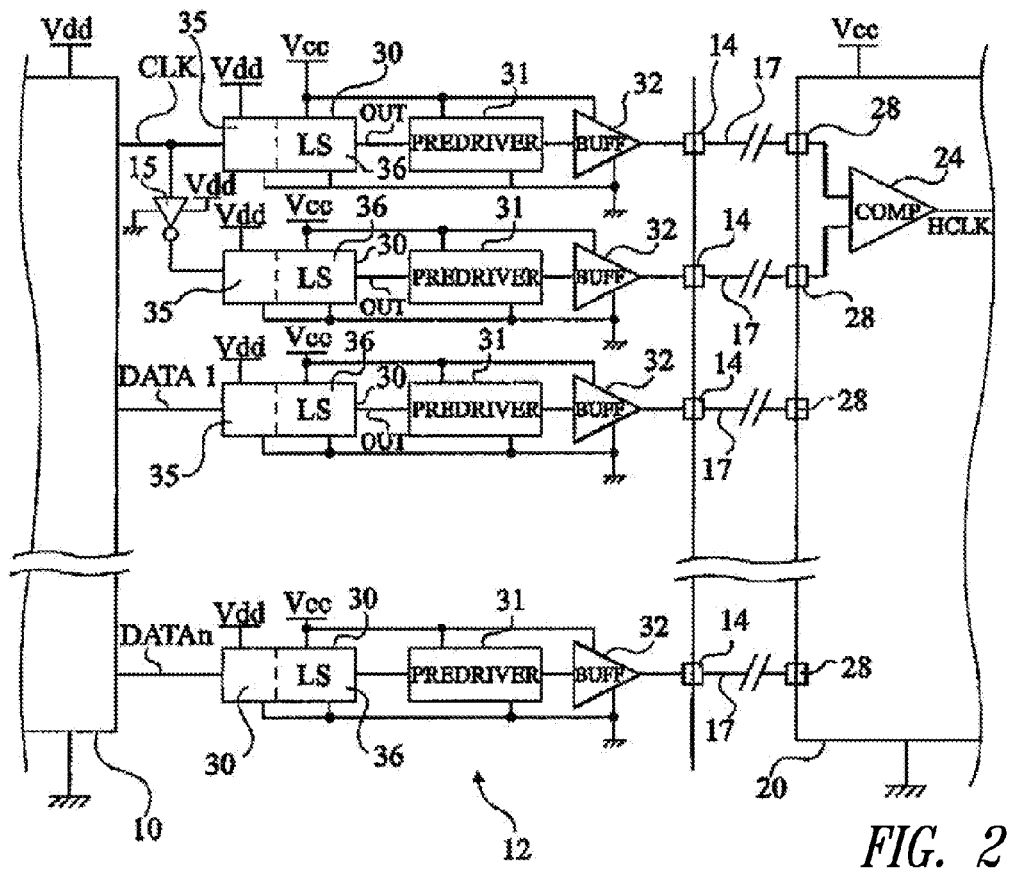
FIG. 2 is a schematic block diagram illustrating an example of input/output circuits of a type to which one embodiment of the present invention may apply as an example.
Figure 7:
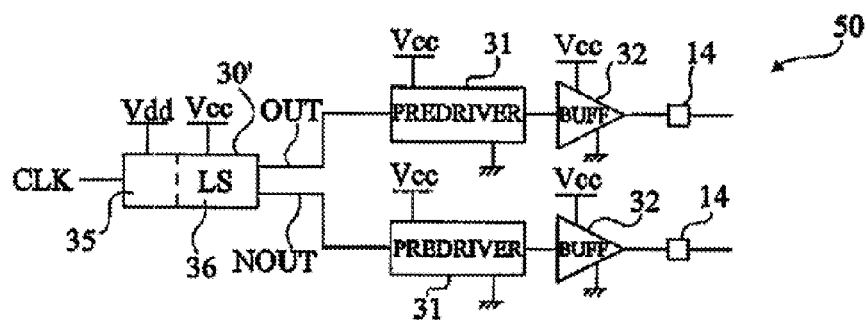
FIG. 7 is a schematic block diagram illustrating an example of application of an embodiment of a level shifter of the present invention to a differential clock interface circuit.

FIG. 7 illustrates the use of a level shifter of the type of that in FIG. 5 in an application to a stage 50 outputting a differential clock signal CLK, for example, in the application illustrated in FIG. 2. As compared with the circuit of FIG. 2, the differential structure of the level shifter of FIG. 5 enables using but a single shifter 30' having its two outputs OUT and NOUT sent to the inputs of the pre-amplification circuits 31 (PREDRIVER) of each of the branches. As previously, buffer amplifiers 32 (BUFF) are generally present before analog output terminals 14 intended for the memory, not shown.

Another feature of an embodiment of the present invention in this application is that it spares a level shifter in the output interface and the associated power consumption.

A feature of an embodiment of the present invention is that the level shifters exploiting data signals DATA1 to DATAn (FIG. 2) may be identical to the level shifter of the clock signal, an embodiment of the device of the present invention being compatible both with periodic signals and with pseudo-random signals (non periodic).

In case of the use of several level shifters in a same input-output device, these circuits may share same signals HVbias and LVbias.

Figure 8:
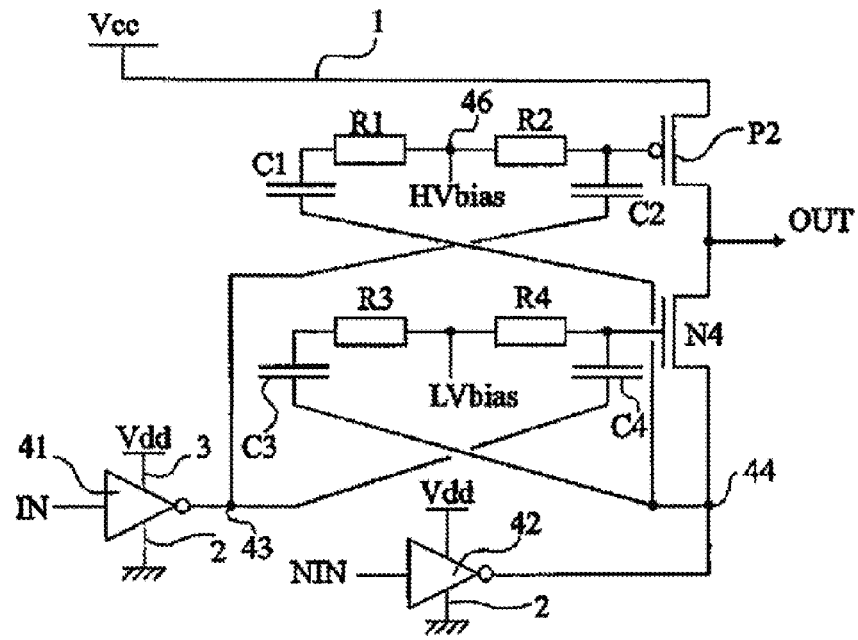
FIG. 8 shows a second embodiment of a level shifter according to the present invention.

FIG. 8 shows a second embodiment of a level shifter according to the present invention applied to a non-differential output. In this case, transistors P1 and N3 of FIG. 5 may be omitted, the rest of the circuit being identical. It will however be ascertained to maintain the symmetry of the capacitive elements to avoid disturbing the bias voltages with dynamic currents caused by the edges of signals IN and NIN. A feature of suppressing transistors P1 and N3 if the differential structure is not necessary is to decrease the static and dynamic power consumptions.

Figure 9:
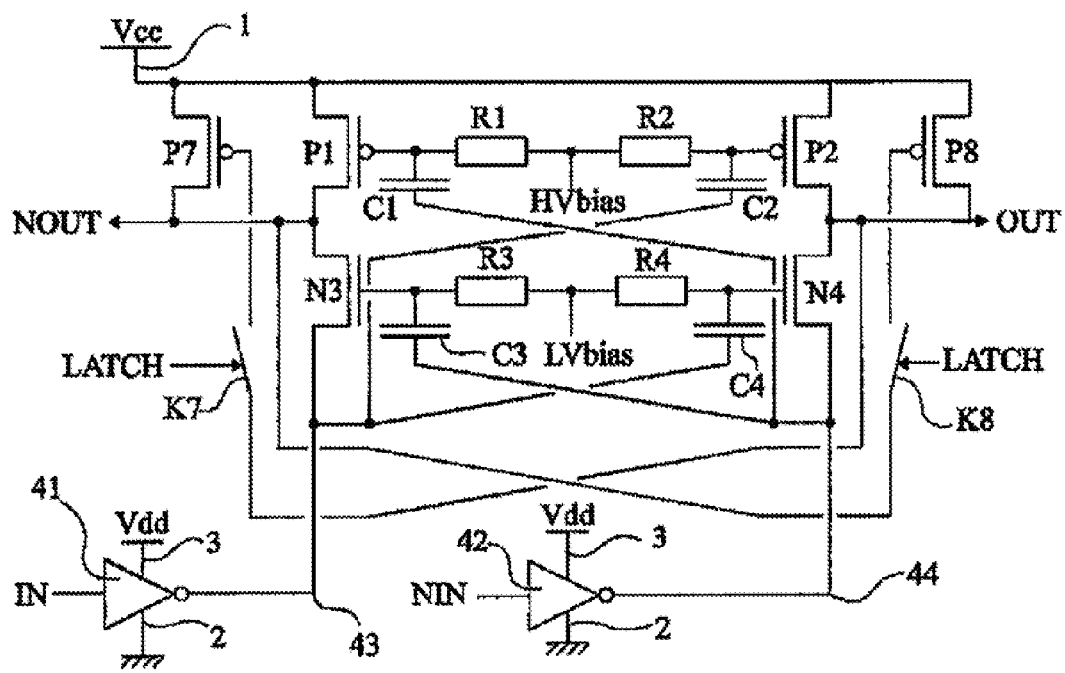
FIG. 9 shows a variation of an embodiment of the level shifter of FIG. 5.

FIG. 9 shows an embodiment that provides a variation of the device of FIG. 5 adapted to a selection between the operation described in relation with FIG. 5 and an operation under a lower frequency, but with no static power consumption. Such a variation may for example be used in tests of input/output circuits for which it is desired to be able to exploit the level shifters without for all this generating a power consumption.

In FIG. 9, two additional P-channel MOS transistors P7 and P8 are placed in parallel with transistors P1 and P2, respectively. The gates of these transistors are connected to output terminal OUT, NOUT of the opposite branch via a switch K7, respectively K8, controlled by a signal LATCH. Transistors P7 and P9 reproduce in a way the locking structure of FIG. 1 by here taking advantage of the presence of transistors N3 and N4 of the structure of FIG. 5. Switches K7 and K8 are MOS transistor switches formed, for example, of two N- and P-channel transistors to form a pass gate.

Although this has not been shown in FIG. 9, the passing to the test or low power consumption mode under control of signal LATCH causes not only the turning on of switches K7 and K8, but also the forced turning off of transistors P1, P2 and the forced conduction of transistors N3 and N4, bringing voltages HVbias and LVbias to level Vcc and Vdd, respectively. The source voltage of transistors 43 and 44 remains lower than level Vdd to avoid damaging the transistors of inverters 41, 42, and 48.

Of course, one or more embodiments of the present invention is likely to have various alterations, improvements, and modifications which will readily occur to those skilled in the art having the benefit of this disclosure. In particular, the selection of the resistors and capacitive elements is within the abilities of those skilled in the art according to the operating frequencies selected for the time constants to approximately correspond to the maximum half-period to be processed by the level shifter.

Further, although one or more embodiments of the present invention has been discussed in relation with a positive level shifter, it easily transposes by inverting the conductivity types of transistors with a level shifter towards negative voltages.

Moreover, although reference has been made to positive voltages and to a ground, it will be easily understood that the voltages are relative with respect to one another provided for the input and output signals to have a common voltage (generally, the ground).

Finally, although one or more embodiments of the present invention has been discussed in relation with MOS transistors, the analog transistors may be replaced with other switches such as IGBT transistors.

The above description of illustrated embodiments, including what is described in the Abstract, is not intended to be exhaustive or to limit the invention to the precise forms disclosed. While specific embodiments and examples are described herein for illustrative purposes, various equivalent modifications are possible within the scope of the invention and can be made without deviating from the spirit and scope of the invention.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A device for shifting a level of a first signal of relatively low amplitude which is a function of a first supply voltage to a second signal of relatively high amplitude which is a function of a second supply voltage, comprising, between a first supply terminal of application of the second supply voltage and a first input terminal, a branch of two transistors of opposite types in series, having their junction point defining an output terminal, respective control terminals of the transistors being coupled to terminals of application of relatively high and low bias voltages by first resistive elements, a second input terminal, receiving an inverse of a signal applied on the first input terminal, being coupled to each of the control terminals of the transistors by first capacitive elements and the first input terminal being coupled to each of the terminals of application of the bias voltages by second capacitive elements in series with second resistive elements.

2. The device of claim 1 wherein the bias voltages are such that the low bias voltage tends to make the transistor coupled to said first input terminal more conductive than the transistor coupled to said first supply terminal.

3. The device of claim 1 wherein a second branch of two transistors of opposite types in series couples said first supply terminal of application of the second supply voltage to the second input terminal, control terminals of the transistors of the second branch being coupled to junction points of the second capacitive and resistive elements, a junction point of the second branch defining a second output terminal providing a signal inverted with respect to a signal provided by the first output terminal.

4. The device of claim 1 wherein the capacitive elements have values on an order of one femtofarad.

5. The device of claim 1 wherein the capacitive elements all have same values, the resistive elements all having same values.

6. The device of claim 1 wherein the capacitive elements associated with the transistors of a first type have a lower value than the capacitive elements associated with the transistors of a second type, their corresponding resistive elements following an inverse variation.

7. The device of claim 1 wherein said input terminals correspond to respective outputs of inverters receiving as an input digital signals inverted with respect to each other, said inverters being powered by said first supply voltage.

8. The device of claim 3 wherein said first supply terminal of application of the second supply voltage is coupled to each output terminal by an additional transistor of a first type, a control terminal of each additional transistor being connected by a controllable switch to the other output terminal.

9. The device of claim 1 wherein the transistors of opposite types are P-channel MOS transistors and N-channel MOS transistors, the supply voltages being positive with respect to a common reference level.

10. An input/output device receiving at least a first digital signal of relatively low amplitude from a digital circuit and providing at least one signal of relatively high amplitude intended for a second circuit, comprising at least one level shifter according to claim 1.

11. The device of claim 10 wherein said received signal is a non-periodic signal.

12. The device of claim 10 wherein the at least one signal of relatively high amplitude is a differential clock signal.

13. An apparatus to shift a level of a first signal of relatively low amplitude that is a function of a first supply voltage to a second signal of relatively high amplitude that is a function of a second supply voltage, the apparatus comprising:
   a first branch coupled between a first input terminal and a first supply terminal adapted to receive the second supply voltage, the first branch including first transistor of a first conductivity type coupled to a second transistor of a second conductivity type opposite to the first conductivity type, a first junction point of said first and second transistors defining a first output terminal, a control terminal of the first transistor being coupled to a first bias voltage and a control terminal of the second transistor being coupled to a second bias voltage;
   a first pair capacitors to respectively couple a second input terminal, adapted to receive an inverse of a signal provided to the first input terminal, to said control terminals of the first and second transistors; and
   a second pair of capacitors to respectively couple the first input terminal to said first and second bias voltages.

14. The apparatus of claim 13, further comprising:
   a first resistor coupled between the first input terminal and the first bias voltage;
   a second resistor coupled between the first input terminal and the second bias voltage;
   a third resistor coupled between the second input terminal and the first bias voltage; and
   a fourth resistor coupled between the second input terminal and the second bias voltage.

15. The apparatus of claim 13 wherein said first bias voltage is lower relative to the second bias voltage.

16. The apparatus of claim 13 wherein said first transistor is an N-channel transistor and said second transistor is a P-channel transistor.

17. The apparatus of claim 13, further comprising a second branch coupled between said second input terminal and said first supply terminal, the second branch including a pair of transistors of opposite conductivity type coupled to each other at a second junction point, said second junction point defining a second output terminal adapted to provide an output signal that is an inverse of a signal provided at said first output terminal, wherein control terminals of said pair of transistors are respectively coupled to said first and second bias voltages.

18. The apparatus of claim 17, further comprising:
   a first additional transistor coupled to the first supply terminal and having a control terminal coupleable to the first output terminal by a first switch; and
   a second additional transistor coupled to the first supply terminal and having a control terminal coupleable to the second output terminal by a second switch.

19. The apparatus of claim 13 wherein said first bias voltage is adapted to make the first transistor coupled more conductive than the second transistor.

20. A system, comprising:
   a first circuit block to provide a first signal;
   a second circuit block to receive a second signal; and
   a lever shifter circuit coupled between the first and second circuit blocks to shift a level of said first signal to provide said second signal, the lever shifter circuit including:
   a first branch coupled between a first input terminal and a first supply terminal, the first branch including first transistor of a first conductivity type coupled to a second transistor of a second conductivity type opposite to the first conductivity type, a first junction point of said first and second transistors defining a first output terminal, a control terminal of the first transistor being coupled to a first bias voltage and a control terminal of the second transistor being coupled to a second bias voltage;
   a first pair of capacitors to respectively couple a second input terminal, adapted to receive an inverse of a signal provided to the first input terminal, to said control terminals of the first and second transistors; and
   a second pair of capacitors to respectively couple the first input terminal to said first and second bias voltages.

21. The system of claim 20 wherein said first circuit block is an integrated circuit core and wherein said second circuit block is a memory.

22. The system of claim 20 wherein said level shifter further includes a second branch coupled between said second input terminal and said first supply terminal, the second branch including a pair of transistors of opposite conductivity type coupled to each other at a second junction point, said second junction point defining a second output terminal adapted to provide an output signal that is an inverse of a signal provided at said first output terminal, wherein control terminals of said pair of transistors are respectively coupled to said first and second bias voltages.

23. The system of claim 20, further comprising at least one predriver circuit coupled in series with a buffer circuit, coupled to said first output terminal and to said second circuit block.

* * * * *

UNITED STATES PATENT AND TRADEMARK OFFICE
CERTIFICATE OF CORRECTION

| | | |
|---|---|---|
| PATENT NO. | : 7,466,184 B2 | Page 1 of 1 |
| APPLICATION NO. | : 11/755189 | |
| DATED | : December 16, 2008 | |
| INVENTOR(S) | : Nicolas Richard et al. | |

It is certified that error appears in the above-identified patent and that said Letters Patent is hereby corrected as shown below:

Column 11
Line 31, claim 13, "including first transistor" should read as --including a first transistor--.

Line 39, claim 13, "a first pair capacitors" should read as --a first pair of capacitors--.

Column 12
Line 4, claim 17, "opposite conductivity type" should read as --opposite conductivity types--.

Lines 19-20, claim 19, "transistor coupled more conductive" should read as --transistor coupled thereto more conductive--.

Lines 28-29, claim 20, "including first transistor" should read as --including a first transistor--.

Lines 48-49, claim 22, "opposite conductivity type" should read as --opposite conductivity types--.

Signed and Sealed this

Twenty-ninth Day of June, 2010

David J. Kappos
*Director of the United States Patent and Trademark Office*